(12) United States Patent
Hu et al.

(10) Patent No.: US 8,952,244 B2
(45) Date of Patent: Feb. 10, 2015

(54) SOLAR CELL

(75) Inventors: Yen-Cheng Hu, New Taipei (TW); Peng Chen, New Taipei (TW); Shuo-Wei Liang, Hsinchu County (TW); Zhen-Cheng Wu, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 967 days.

(21) Appl. No.: 13/089,321

(22) Filed: Apr. 19, 2011

(65) Prior Publication Data

US 2012/0167973 A1 Jul. 5, 2012

(30) Foreign Application Priority Data

Dec. 29, 2010 (TW) ................. 99146606 A

(51) Int. Cl.
*H01L 31/00* (2006.01)
*H01L 31/0216* (2014.01)
*H01L 31/0224* (2006.01)
*H01L 31/0352* (2006.01)
*H01L 31/068* (2012.01)

(52) U.S. Cl.
CPC .. *H01L 31/02168* (2013.01); *H01L 31/022441* (2013.01); *H01L 31/035209* (2013.01); *H01L 31/035227* (2013.01); *H01L 31/0682* (2013.01); *Y02E 10/547* (2013.01)
USPC ........................................ 136/256

(58) Field of Classification Search
CPC .................. H01L 31/022441; H01L 31/2363; H01L 31/2366
See application file for complete search history.

(56) References Cited

U.S. PATENT DOCUMENTS

| | | |
|---|---|---|
| 4,688,068 A | 8/1987 | Chaffin et al. |
| 5,496,415 A | 3/1996 | Barnham |

(Continued)

FOREIGN PATENT DOCUMENTS

| | | |
|---|---|---|
| TW | I233161 | 5/2005 |
| TW | I287297 | 9/2007 |

(Continued)

OTHER PUBLICATIONS

Hou-Ying Huang, Abstract of "Study of Silicon-Based Solar Cell" with English thereof, Master thesis of National Taiwan University of Science and Technology, accepted on Jun. 20, 2006, Taipei, Taiwan.

*Primary Examiner* — Eli Mekhlin
(74) *Attorney, Agent, or Firm* — Jianq Chyun IP Office

(57) ABSTRACT

A solar cell includes a semiconductor substrate, a doping layer, a quantum well layer, a first passivation layer, a second passivation layer, a first electrode and a second electrode. The semiconductor substrate has a front surface and a back surface, and the front surface of the semiconductor substrate includes nano-rods. The doping layer covers the surface of the nano-rods. The electrode layers cover the doping layer. The quantum well layer having at least one first doping region and at least one second doping region is disposed on the semiconductor substrate. The quantum well layer includes polycrystalline silicon germanium ($Si_{1-x}Ge_x$). The first passivation layer and the second passivation layer cover the first and the second doping regions of the quantum well layer, respectively. The first electrode and the second electrode are electrically connected to the first doping region and the second doping region of the quantum well layer, respectively.

8 Claims, 3 Drawing Sheets

(56) References Cited

U.S. PATENT DOCUMENTS

| | | | |
|---|---|---|---|
| 6,399,873 B1 * | 6/2002 | Sano et al. | 136/249 |
| 6,852,920 B2 | 2/2005 | Sager et al. | |
| 7,468,485 B1 * | 12/2008 | Swanson | 136/243 |
| 2002/0112755 A1 * | 8/2002 | Kibbel et al. | 136/261 |
| 2004/0200520 A1 * | 10/2004 | Mulligan et al. | 136/256 |
| 2005/0098205 A1 | 5/2005 | Roscheisen et al. | |
| 2007/0084505 A1 * | 4/2007 | Zaidi | 136/256 |
| 2007/0169808 A1 * | 7/2007 | Kherani et al. | 136/258 |
| 2008/0314443 A1 * | 12/2008 | Bonner et al. | 136/255 |
| 2009/0211626 A1 * | 8/2009 | Akimoto | 136/252 |

FOREIGN PATENT DOCUMENTS

| | | |
|---|---|---|
| TW | 200924206 | 6/2009 |
| TW | M373564 | 2/2010 |

* cited by examiner

SOLAR CELL

CROSS-REFERENCE TO RELATED APPLICATION

This application claims the priority benefit of Taiwan application serial no. 99146606, filed Dec. 29, 2010. The entirety of the above-mentioned patent application is hereby incorporated by reference herein and made a part of this specification.

BACKGROUND OF THE APPLICATION

1. Field of the Invention

The present invention generally relates to a solar cell, and more particularly, to a back side contact solar cell.

2. Description of Related Art

Silicon-based solar cell is one of the solar cells generally used in the field. The principle of a silicon-based solar cell is to add dopants in a semiconductor material (silicon) with high purity, such that the semiconductor material presents different characteristics and forms p-type semiconductors and n-type semiconductors. After conjugating these two types of semiconductors, p-n conjunctions are formed. When the sunlight irradiates on a semiconductor with a p-n structure, the energy provided by photons may excite the electrons in the semiconductor and generate electron-hole pairs. A solar cell is constituted by disposing electrodes such that the holes move toward the direction of the electric field and the electrons move toward the opposite direction.

In general, with the thickness of the semiconductor material in a solar cell becomes less, the amount of incident light in the front surface and the amount of light absorbed in the back surface of the solar cell would decrease. Therefore, under the trend of developing thinner solar cells, how to increase the amount of light absorbed by a solar cell becomes one of the key points in the research and development.

SUMMARY OF THE INVENTION

The present invention is directly to a solar cell capable of increasing the amount of light absorbed by the solar cell so as to increase the efficiency of the solar cell.

A solar cell is provided in one embodiment of the present invention, comprising a semiconductor substrate, a doping layer, a front anti-reflective layer, an auxiliary passivation layer, a quantum well layer, a first passivation layer, a second passivation layer, a back reflective layer, at least one first electrode and at least one second electrode. The semiconductor substrate has a front surface and a back surface, wherein the front surface of the semiconductor substrate has a plurality of nano-rods. The doping layer covers a surface of the nano-rods. The front anti-reflective layer covers the doping layer. The auxiliary passivation layer is disposed on the back surface of the semiconductor substrate. The quantum well layer is disposed on the auxiliary passivation layer, and the quantum well layer has at least one first doping region and at least one second doping region, wherein the quantum well layer comprises polycrystalline silicon germanium $(Si_{1-x}Ge_x)$, and $0<x\leq1$. The first passivation layer covers the first doping region of the quantum well layer. The second passivation layer covers the second doping region of the quantum well layer. The back reflective layer covers the first passivation layer and the second passivation layer. The first electrode and the second electrode electrically connect to the first doping region and the second doping region of the quantum well layer, respectively.

A solar cell is provided in one embodiment of the present invention, comprising a semiconductor substrate, a doping layer, a front anti-reflective layer, an auxiliary passivation layer, a quantum well layer, a first passivation layer, a second passivation layer, a back reflective layer, at least one first electrode and at least one second electrode. The semiconductor substrate has a front surface and a back surface, wherein the front surface of the semiconductor substrate has a plurality of nano-rods. The doping layer covers the surface of the nano-rods. The front anti-reflective layers cover the doping layer. The auxiliary passivation layer is disposed on the back surface of the semiconductor substrate. The quantum well layer is disposed on the auxiliary passivation layer, and the quantum well layer has at least one first doping region and at least one second doping region, wherein the quantum well layer comprises at least one polycrystalline silicon germanium $(Si_{1-x}Ge_x)$ and at least one second polycrystalline silicon germanium $(Si_{1-y}Ge_y)$ which alternatively stacked together, wherein $0\leq x<1$, and $0\leq y<1$. The first passivation layer covers the first doping region of the quantum well layer. The second passivation layer covers the second doping region of the quantum well layer. The back reflective layer covers the first passivation layer and the second passivation layer. The first electrode and the second electrode electrically connected to the first doping region and the second doping region of the quantum well layer, respectively.

Based on the above descriptions, the semiconductor substrate of the solar cell in the present invention has a plurality of nano-rods, and the quantum well layer of the solar cell comprises polycrystalline silicon germanium $(Si_{1-x}Ge_x)$, wherein $0<x\leq1$, or the quantum well layer is constituted by at least one polycrystalline silicon germanium $(Si_{1-x}Ge_x)$ and at least one second polycrystalline silicon germanium $(Si_{1-y}Ge_y)$ which alternatively stacked together, wherein $0\leq x<1$, and $0\leq y<1$. By the combination of the nano-rods and the special material of the quantum well layer, the amount of light absorbed by the solar cell is effectively elevated, and the efficiency of the solar cell is further enhanced.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
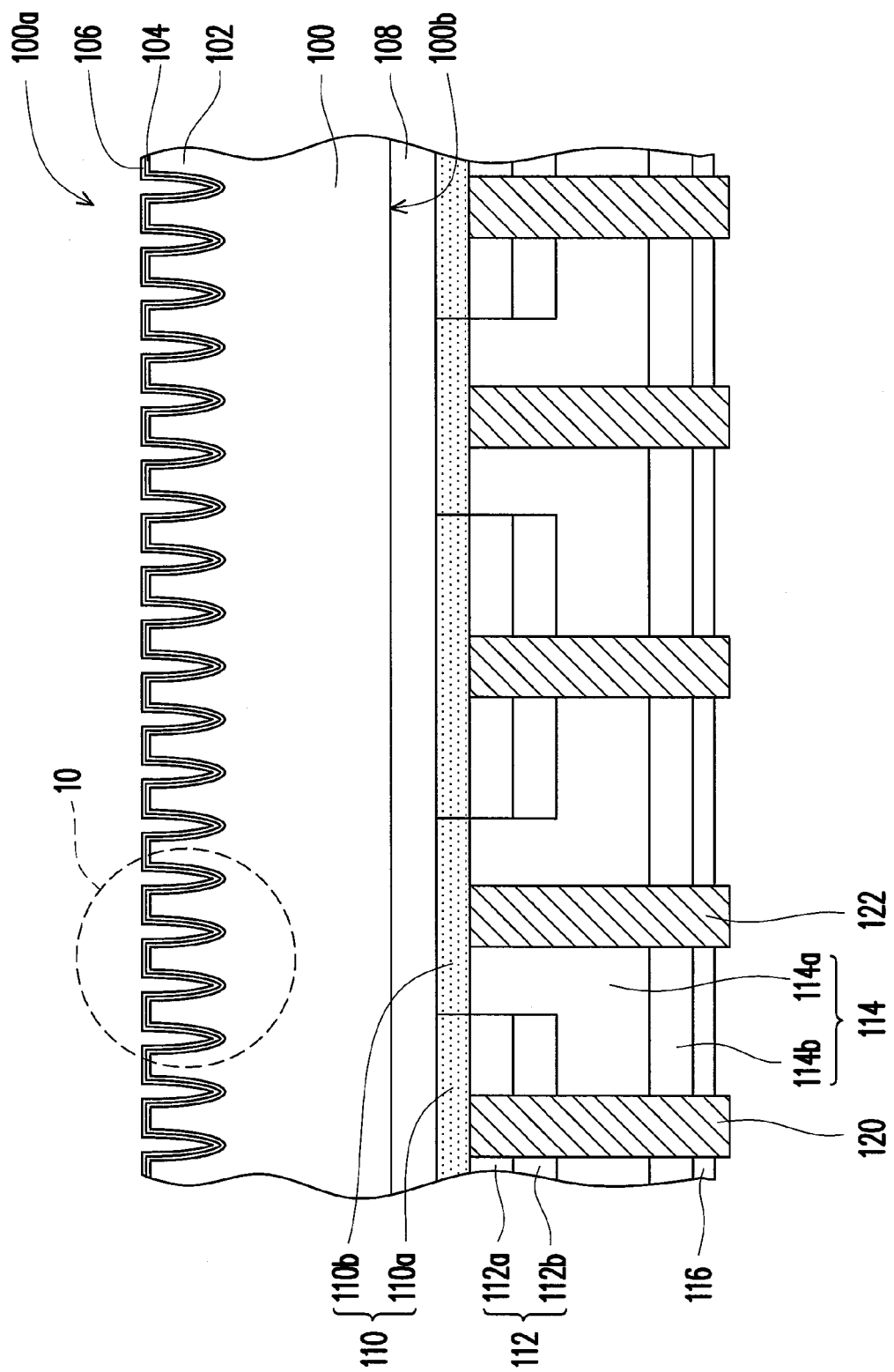
FIG. 1 is a schematic cross-sectional view of a solar cell according to one embodiment of the present invention.

FIG. 1 is a schematic cross-sectional view of a solar cell according to one embodiment of the present invention. Referring to FIG. 1, the solar cell of this embodiment comprises a semiconductor substrate 100, a doping layer 104, a front anti-reflective layer 106, an auxiliary passivation layer 108, a quantum well layer 110, a first passivation layer 112, a second passivation layer 114, a back reflective layer 116, at least one first electrode 120 and at least one second electrode 122.

The semiconductor substrate 100 has a front surface 100a and a back surface 100b. The material of the semiconductor substrate 100 is, for example, a semiconductor material doped with N-type dopants. The material of the semiconductor substrate 100 can be silicon, cadmium sulfide (CdS), CuInGaSe$_2$ (CIGS), CuInSe$_2$ (CIS), cadmium telluride (CdTe), organic materials or a multi-layer structure stacked by the above materials. The silicon described above comprises single crystal silicon, polycrystal silicon, amorphous silicon or microcrystal silicon. Said N-type dopants can be selected from the group V elements in the periodic table of the elements such as phosphor (P), arsenic (As) or antimony (Sb).

Figure 3:
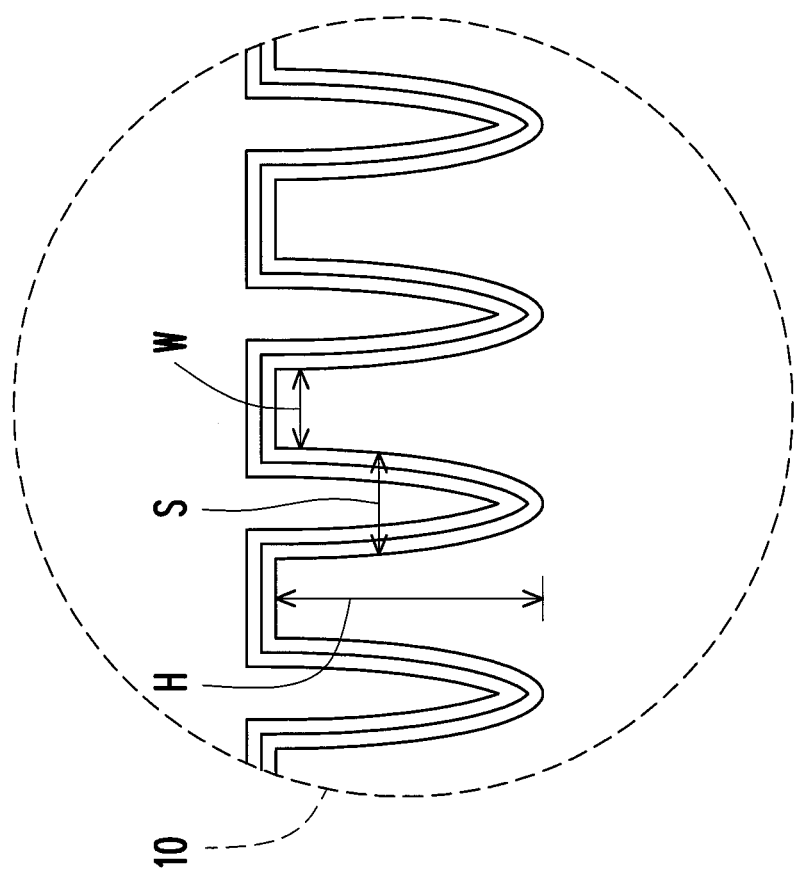
FIG. 3 is a schematic partial enlarged view of reference number 10 in FIG. 1.

In particular, the front surface 100a of the semiconductor substrate 100 has a plurality of nano-rods 102. The partial enlarged view of these nano-rods 102 (the reference number 10 in FIG. 1) is shown in FIG. 3. According to this embodiment, the height H of the nano-rods 102 is 0.005~20 μm, preferably 3~20 μm. The width W of the nano-rods 102 is 0.005~5 μm, preferably 0.1~5 μm. The distance S between the adjacent nano-rods 102 is 0.005~5 μm, preferably 0.1~5 μm.

Methods such as electrochemical process, photolithography and etching process or light etching process can be adopted for forming the nano-rods 102 on the front surface 100a of the semiconductor substrate 100.

As shown in FIG. 1 and FIG. 3, the doping layer 104 covers and contacts the surface of nano-rods 102 which may be formed on the front surface 100a of the semiconductor substrate 100. In more detail, the doping layer 104 conformably covers the surface of nano-rods 102, so that the spaces between the nano-rods 102 are not fully filled. The material of the doping layer 104, for example, is a semiconductor material doped with N-type dopants. Said N-type dopants can be selected from the group V elements in the periodic table of the elements such as P, As or Sb. The material of the doping layer 104 can be silicon, CdS, CuInGaSe$_2$ (CIGS), CuInSe$_2$ (CIS), CdTe, organic materials or a multi-layer structure stacked by the above materials. The silicon described above comprises single crystal silicon, polycrystal silicon, amorphous silicon or microcrystal silicon.

The front anti-reflective layer 106 covers the doping layer 104. In more detail, the front anti-reflective layer 106 conformably covers and contacts the doping layer 104 which is on the surface of the nano-rods 102. Therefore, the spaces between the nano-rods 102 are not fully filled by the front anti-reflective layer 106. According to this embodiment, the front anti-reflective layer 106 is a transparent layer, so that the sunlight could irradiate from the top of the front surface 100a of the semiconductor substrate 100 to the inside of the solar cell. The material of the front anti-reflective layer 106 comprises metal oxides such as indium tin oxide (ITO), indium zinc oxide (IZO), aluminum tin oxide (ATO), aluminum zinc oxide (AZO), indium germanium zinc oxide, other suitable oxides, or a stacked layer composed of at least two of the above materials, or materials which can be used for anti-reflection such as silicon oxide, silicon nitride, or a combination of the above materials.

As described above, since the spaces between the nano-rods 102 are not fully filled by the doping layer 104 and the front anti-reflective layer 106 which covers the surface of the nano-rods 102, the structure of the front surface 100a of the semiconductor substrate 100 is rough. In other words, the structure of the front surface 100a of the semiconductor substrate 100 has a larger surface area because of the nano-rods 102. Therefore, the amount of absorbed sunlight can be increased.

The auxiliary passivation layer 108 is disposed on the back surface 100b of the semiconductor substrate 100. The material of the auxiliary passivation layer 108, for example, is silicon nitride oxide, silicon oxide, silicon nitride, or other anti-reflective materials.

The quantum well layer 110 is disposed on the auxiliary passivation layer 108. The auxiliary passivation layer 108 is disposed between the quantum well layer 110 and the semiconductor substrate 100, and the quantum well layer 110 comprises polycrystalline silicon germanium ($Si_{1-x}Ge_x$), wherein $0<x\leq1$. According to this embodiment, the quantum well layer 110 can be a single layer of polycrystalline Ge (poly-Ge). According to another embodiment in the present invention, the quantum well layer 110 can be a single layer of polycrystalline silicon germanium (poly-SiGe).

In addition, the quantum well layer 110 has at least one first doping region 110a and at least one second doping region 110b. The first doping region 110a can be doped with N-type dopants, for example. Said N-type dopants can be selected from the group V elements of the periodic table of the elements, such as P, As or Sb. The second doping region 110b can be doped with P-type dopants, for example. Said P-type dopants can be selected from the group III elements of the periodic table of the elements, such as boron (B), aluminum (Al), gallium (Ga) or indium (In).

The first passivation layer 112 covers the first doping region 110a of the quantum well layer 110, but does not cover the second doping region 110b of the quantum well layer 110. The second passivation layer 114 covers the second doping region 110b of the quantum well layer 110 and at least partially covers the first passivation layer 112. According to this embodiment, the first passivation layer 112 comprises the first doping passivation material 112a and the first passivation material 112b, wherein the first doping passivation material 112a is sandwiched between the first passivation material 112b and the first doping region 110a. The second passivation layer 114 comprises the second doping passivation material 114a and the second passivation material 114b, wherein the second doping passivation material 114a is sandwiched between the second passivation material 114b and the second doping region 110b. The second doping passivation material 114a at least partially covers the first passivation material 112b.

According to the this embodiment, the materials of the first passivation layer 112 and the second passivation layer 114 comprises silicon oxide, silicon nitride, or silicon oxynitride, preferably silicon oxide. In more detail, the first doping passivation material 112a of the first passivation layer 112 comprises silicon oxide, silicon nitride or silicon oxynitride, which doped with N-type dopants, and the first passivation material 112b of the first passivation layer 112 comprises silicon oxide, silicon nitride, or silicon oxynitride. More preferably, the first doping passivation material 112a of the first passivation layer 112 comprises silicon oxide doped with N-type dopants, and the first passivation material 112b of the first passivation layer 112 comprises silicon oxide. In addition, the second doping passivation material 114a of the second passivation layer 114 comprises silicon oxide, silicon nitride or silicon oxynitride, which doped with P-type dopants, and the second passivation material 114b of the second passivation layer 114 comprises silicon oxide, silicon nitride, or silicon oxynitride. More preferably, the second doping passivation material 114a of the second passivation layer 114 comprises silicon oxide doped with P-type dopants, and the second passivation material 114b of the second passivation layer 114 comprises silicon oxide.

In other words, the doping type of the first doping region 110a of the quantum well layer 110 and that of the first doping passivation material 112a are rendered the same, and the doping type of the second doping region 110b of the quantum well layer 110 and that of the second doping passivation material 112b are rendered the same. Furthermore, the top portion of the first doping region 110a of the quantum well layer 110 is covered with the auxiliary passivation layer 112 (such as silicon oxide), and its bottom portion is covered with the first passivation layer 112 (such as silicon oxide), therefore a sandwich structure of silicon oxide—the quantum well layer 110 (the first doping region 110a)-silicon oxide is constituted. Similarly, the top portion of the second doping region 110b of the quantum well layer 110 is covered with the auxiliary passivation layer 108 (such as silicon oxide), and its bottom portion is covered with the second passivation layer 114 (such as silicon oxide), therefore a sandwich structure of silicon oxide—the quantum well layer 110 (the second doping region 110b)-silicon oxide is constituted.

Since polycrystalline silicon germanium ($Si_{1-x}Ge_x$) is adopted as the material of the quantum well layer 110, wherein $0<x\leq 1$, and the quantum well layer 110 has the first doping region 110a and the second doping region 110b which constitute p-n junctions, these p-n junctions can be used as infrared ray absorption layers inside the solar cell. Besides, the sandwich structure constituted by the quantum well layer 110, the upper auxiliary passivation layer 108 and the lower first/second passivation layers 112/114 can further enhance the light absorption rate of the infrared-ray absorption layers inside the solar cell, and protect Ge in the quantum well layer 110 from outgasing.

The back reflective layer 116 covers the second passivation layer 114. The material of the back reflective layer 116, for example, is silicon oxynitride, silicon nitride, or other anti-reflective material.

The first electrode 120 and the second electrode 122 are electrically connected with the first doping region 110a and the second doping region 110b of the quantum well layer 110, respectively. The materials of the first electrode 120 and the second electrode 122, for example, are metal electrodes.

As described above, since the solar cell in this embodiment designs a plurality of nano-rods 102 on the front surface 100a of its semiconductor substrate 100, the amount of light absorbed by the front surface of the solar cell can be increased. In addition, the solar cell in this embodiment further adopts the quantum well layer 110 made of polycrystalline silicon germanium ($Si_{1-x}Ge_x$) as the material of the back surface 100b of its semiconductor substrate 100. The quantum well layer 110 has p-n junctions, and a sandwich structure is further constituted by the quantum well layer 110 accompanied with the upper auxiliary passivation layer 108 and the lower first/second passivation layers. The design of the quantum well layer 110 is able to increase the light absorption rate of infrared rays inside the solar cell. In other words, the light absorption rate of the solar cell can be effectively increased in this embodiment by the combination of the nano-rods 102 and the particular materials and structural designs of the quantum well layer 110, so that the efficiency of the solar cell is further increased.

Figure 2:
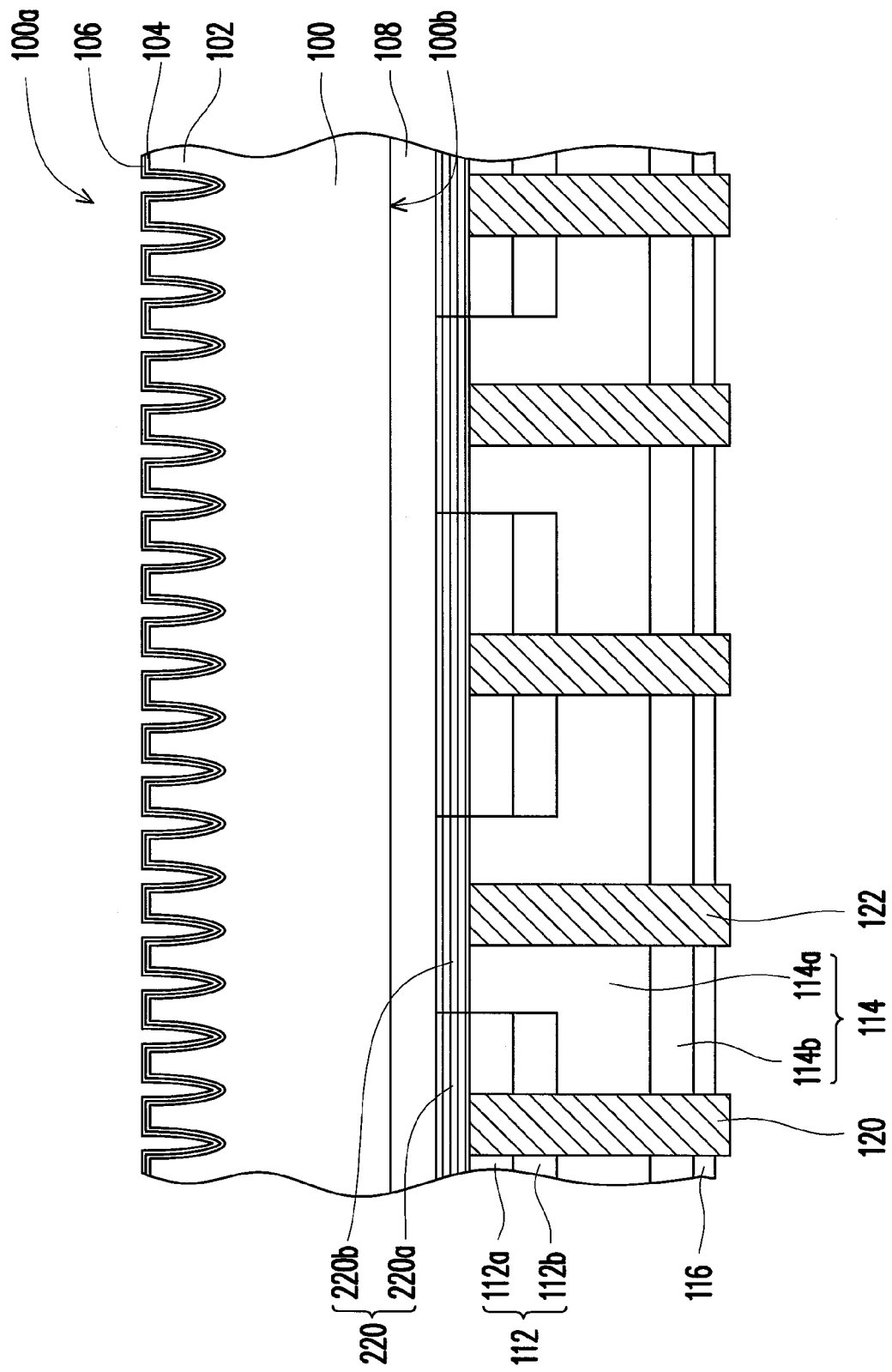
FIG. 2 is a schematic cross-sectional view of a solar cell according to another embodiment of the present invention.

FIG. 2 is a schematic cross-sectional view of a solar cell according to another embodiment of the present invention. The embodiment in FIG. 2 is similar to the embodiment in FIG. 1, so that the components identical to those in FIG. 1 are represented by the same numerals herein without repeats. The difference between the embodiment in FIG. 2 and the embodiment in FIG. 1 lies in that in this embodiment, the quantum well layer 220 is constituted by at least one polycrystalline silicon germanium ($Si_{1-x}Ge_x$) and at least a second polycrystalline silicon germanium ($Si_{1-y}Ge_y$) which alternatively stacked, wherein $0\leq x<1$, $0\leq y<1$. In the present invention, the number of layers of the alternatively stacked polycrystalline silicon germanium ($Si_{1-x}Ge_x$) and polycrystalline silicon germanium ($Si_{1-y}Ge_y$) in the quantum well layer 220 is not limited, which can be two or more. For example, the quantum well layer 220 is constituted by $Si/Si_{1-x}Ge_x/Ge/Si_{1-y}Ge_y$. According to another embodiment, the quantum well layer 220 is constituted by $Si_{1-x}Ge_x/Si_{1-y}Ge_y$.

Similarly, the quantum well layer 220 has at least a first doping region 220a and at least one second doping region 220b. Similarly, the first doping region 220a, for example, is doped with N-type dopants. Said N-type dopants can be selected from the group V elements of the periodic table of the elements such as P, As or Sb. The second doping region 220b, for example, is doped with P-type dopants. Said P-type dopants can be selected from the group III elements of the periodic table of the elements such as B, Al, Ga or In.

In this embodiment, the quantum well layer 220 is constituted by at least one polycrystalline silicon germanium ($Si_{1-x}Ge_x$) and at least one second polycrystalline silicon germanium ($Si_{1-y}Ge_y$) which alternatively stacked. Such quantum well layer 220 constituted by a multi-layer structure has a better absorption rate to the infrared rays inside the solar cell.

As described above, the solar cell in this embodiment designs a plurality of nano-rods 102 in the front surface 100a of its semiconductor substrate 100, therefore the amount of light absorbed by the front surface of the solar cell can be increased. In addition, in the solar cell of this embodiment, the quantum well layer 220 on the back surface of the semiconductor substrate 100 is constituted by at least one polycrystalline silicon germanium ($Si_{1-x}Ge_x$) and at least a second polycrystalline silicon germanium ($Si_{1-y}Ge_y$) which alternatively stacked. Particularly, the quantum well layer 220 has p-n junctions, and the quantum well layer 220 together with the upper auxiliary passivation layer 108 and the lower first/second passivation layers 112/114 further constitute a sandwich structure. The design of the quantum well layer 220 can effectively increase the light absorption rate of infrared rays inside the solar cell. In other words, by the combination of the nano-rods 102 and the particular materials and structural designs of the quantum well layer 220, the light absorption rate of the solar cell in this embodiment can be effectively increased, and the efficiency of the solar cell is further increased.

Although the present invention already disclosed by the embodiments described as above, they are not intended to limit the present invention. It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A solar cell, comprising:
  a semiconductor substrate having a front surface and a back surface, wherein the front surface of the semiconductor substrate has a plurality of nano-rods extending from the front surface, a height of the nano-rods is 0.005 to 20 µm, a width of the nano-rods is 0.005 to 5 µm, and a distance between the adjacent nano-rods is 0.005 to 5 µm;
  a doping layer, disposed on a surface of the nano-rods;
  a front anti-reflective layer covering the doping layer, wherein a material of the front anti-reflective layer is indium tin oxide;

a quantum well layer disposed on the back surface of the semiconductor substrate, the quantum well layer having at least one first doping region and at least one second doping region, wherein the first doping region and the second doping region have opposite conductivity types, the quantum well layer comprises a first polycrystalline silicon germanium ($Si_{1-x}Ge_x$) layer, and the value of x is $0 \leq x \leq 1$;

a first passivation layer, covering the first doping region of the quantum well layer, wherein the first passivation layer comprises a N-type doping passivation material and a first passivation material, and wherein the N-type doping passivation material is sandwiched between the first passivation material and the first doping region;

a second passivation layer, covering the second doping region of the quantum well layer and the N-type doping passivation material, wherein the second passivation layer comprises a P-type doping passivation material and a second passivation material, the P-type doping passivation material is sandwiched between the second passivation material and the second doping region; and at least one first metal electrode and at least one second metal electrode contacting and passing through the P-type doping passivation material to be electrically connected to the first doping region and the second doping region of the quantum well layer, respectively.

2. The solar cell of claim 1, further comprising:

an auxiliary passivation layer disposed between the semiconductor substrate and the quantum well layer; and a backside reflective layer, covering the first passivation layer and the second passivation layer.

3. The solar cell of claim 1, wherein the quantum well layer further comprises at least one second polycrystalline silicon germanium ($Si_{1-y}Ge_y$) alternatively stacked with the first polycrystalline silicon germanium ($Si_{1-x}Ge_x$), wherein $0 \leq x < 1$ and $0 \leq y < 1$.

4. The solar cell of claim 1, wherein the doping layer conformably covers the surface of nano-rods so that a plurality of spaces between the nano-rods are not fully filled.

5. The solar cell of claim 4, wherein the front anti-reflective layer conformably covers and contacts the doping layer so that the spaces between the nano-rods are not fully filled by the front anti-reflective layer.

6. A solar cell, comprising:

a semiconductor substrate having a front surface and a back surface, wherein the front surface of the semiconductor substrate has a plurality of nano-rods extending from the front surface, a height of the nano-rods is 3 to 20 μm, a width of the nano-rods is 0.1 to 5 μm, and a distance between the adjacent nano-rods is 0.1 to 5 μm;

a doping layer, disposed on a surface of the nano-rods;

a front anti-reflective layer covering the doping layer, wherein a material of the front anti-reflective layer comprises indium tin oxide, indium zinc oxide, aluminum tin oxide, aluminum zinc oxide, indium germanium zinc oxide, a stacked layer of at least two of the above materials, or a combination thereof;

a quantum well layer disposed on the back surface of the semiconductor substrate, the quantum well layer having at least one first doping region and at least one second doping region, wherein the first doping region and the second doping region have opposite conductivity types;

a first passivation layer, covering the first doping region of the quantum well layer, wherein the first passivation layer comprises a N-type doping passivation material and a first passivation material, and wherein the N-type doping passivation material is sandwiched between the first passivation material and the first doping region;

a second passivation layer, covering the second doping region of the quantum well layer and the N-type doping passivation material, wherein the second passivation layer comprises a P-type doping passivation material and a second passivation material, the P-type doping passivation material is sandwiched between the second passivation material and the second doping region; and at least one first metal electrode and at least one second metal electrode contacting and passing through the P-type doping passivation material to be electrically connected to the first doping region and the second doping region of the quantum well layer, respectively.

7. The solar cell of claim 6, wherein the doping layer conformably covers the surface of nano-rods so that a plurality of spaces between the nano-rods are not fully filled.

8. The solar cell of claim 7, wherein the front anti-reflective layer conformably covers and contacts the doping layer so that the spaces between the nano-rods are not fully filled by the front anti-reflective layer.

* * * * *